United States Patent [19]

Holcomb

[11] Patent Number: 4,780,950
[45] Date of Patent: Nov. 1, 1988

[54] AXIAL LEAD ELECTRICAL COMPONENT FEEDER

[76] Inventor: Gregory W. Holcomb, 13 Viento, Irvine, Calif. 92714

[21] Appl. No.: 88,828

[22] Filed: Aug. 24, 1987

[51] Int. Cl.$^4$ .............................................. H01R 43/00
[52] U.S. Cl. ................................. 29/566.3; 29/564.6; 29/564.8; 140/105
[58] Field of Search ..................... 29/33 M, 33 K, 566, 29/566.1, 566.2, 566.3, 564.6, 564.8, 739, 741; 140/105

[56] References Cited

U.S. PATENT DOCUMENTS

| | | | |
|---|---|---|---|
| 3,200,481 | 8/1965 | Lenders | 29/741 |
| 3,594,889 | 7/1971 | Clark | 29/741 |
| 3,769,823 | 11/1973 | Greeninger | 29/566.3 |
| 4,198,741 | 4/1980 | Wheeler et al. | 29/566.3 |
| 4,644,633 | 2/1987 | Jones et al. | 29/566.3 |

FOREIGN PATENT DOCUMENTS

| | | | |
|---|---|---|---|
| 1916541 | 1/1971 | Fed. Rep. of Germany | 29/564.6 |
| 1064495 | 12/1983 | U.S.S.R. | 29/33 M |
| 1148135 | 3/1985 | U.S.S.R. | 29/741 |
| 1176463 | 8/1985 | U.S.S.R. | 29/739 |

Primary Examiner—Gil Weidenfeld
Assistant Examiner—Daniel W. Howell
Attorney, Agent, or Firm—Roberts and Quiogue

[57] ABSTRACT

A component lead cutting and forming apparatus which includes a movable carriage and a bending die secured thereto for supporting the first and second leads of an axial lead component in process. A translatable cutting and forming assembly is provided for (a) providing strain relief clamping of the leads of the component in process against the component supporting bending die, (b) cutting the leads of the component in process, and (c) cooperating with the component supporting bending die to bend the leads of the component in process, when the movable carriage and the component supporting bending die is in a first position beneath the translatable cutting and forming assembly. Driving apparatus translates the movable carriage between such first position and a second position, wherein at the second position the axial lead component having cut and formed leads is presented for robotic pick-up.

6 Claims, 5 Drawing Sheets

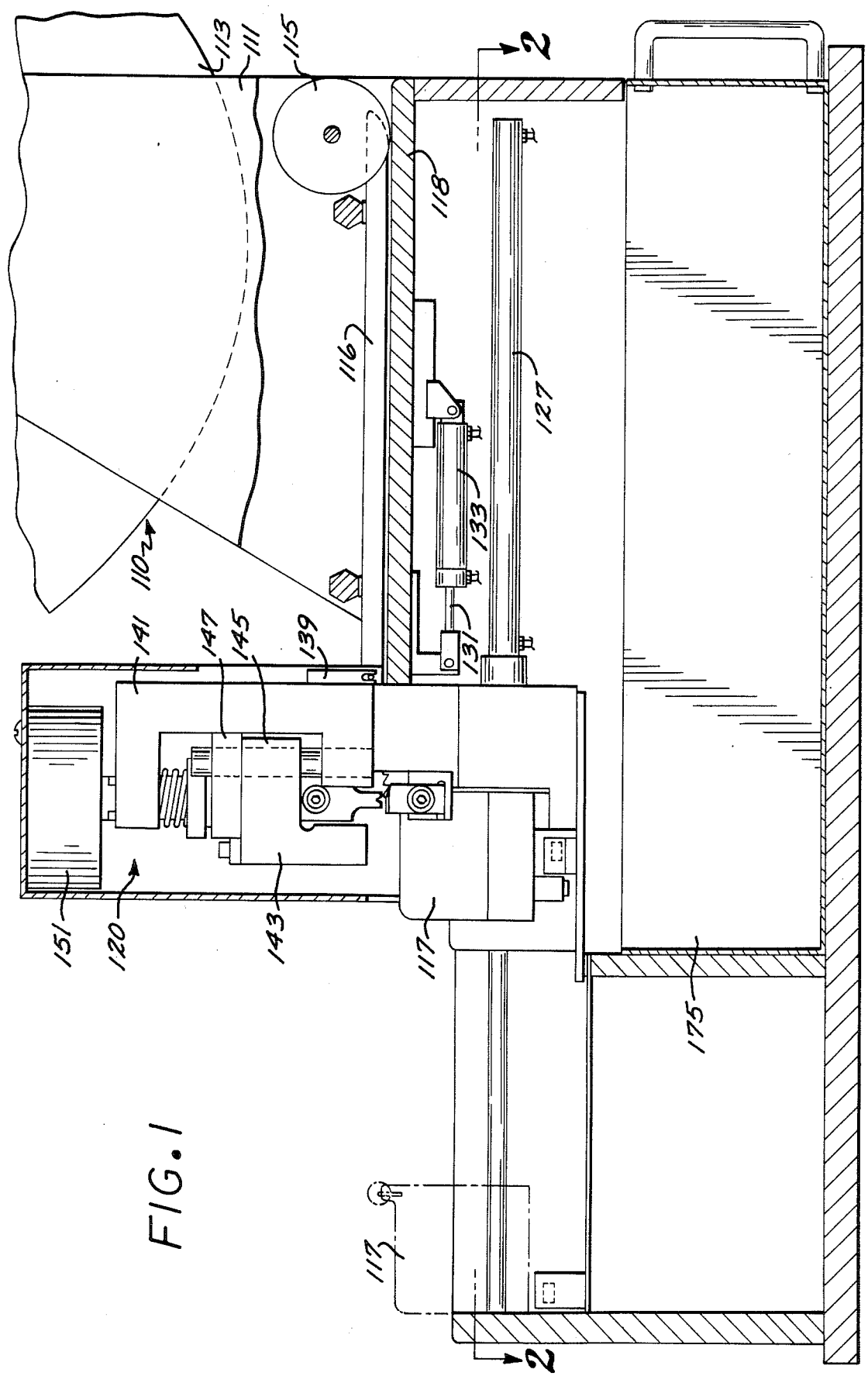

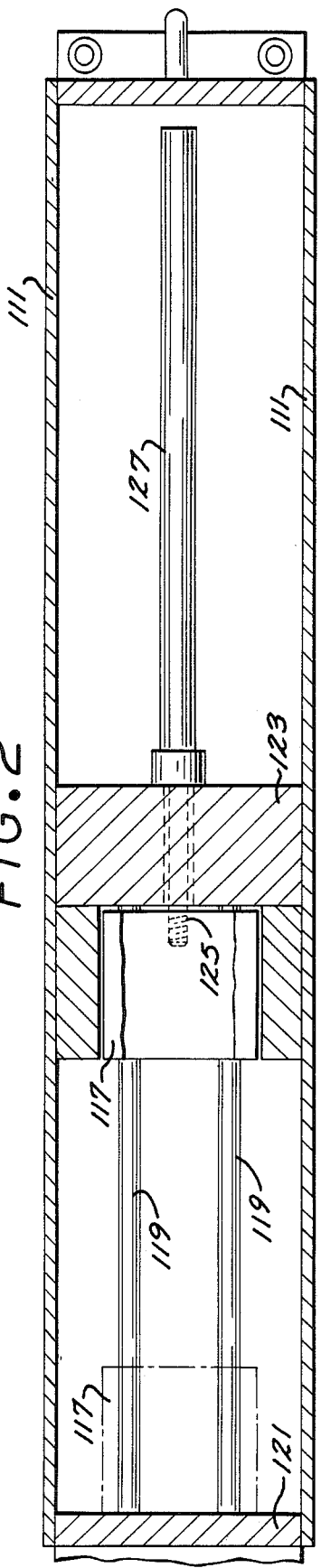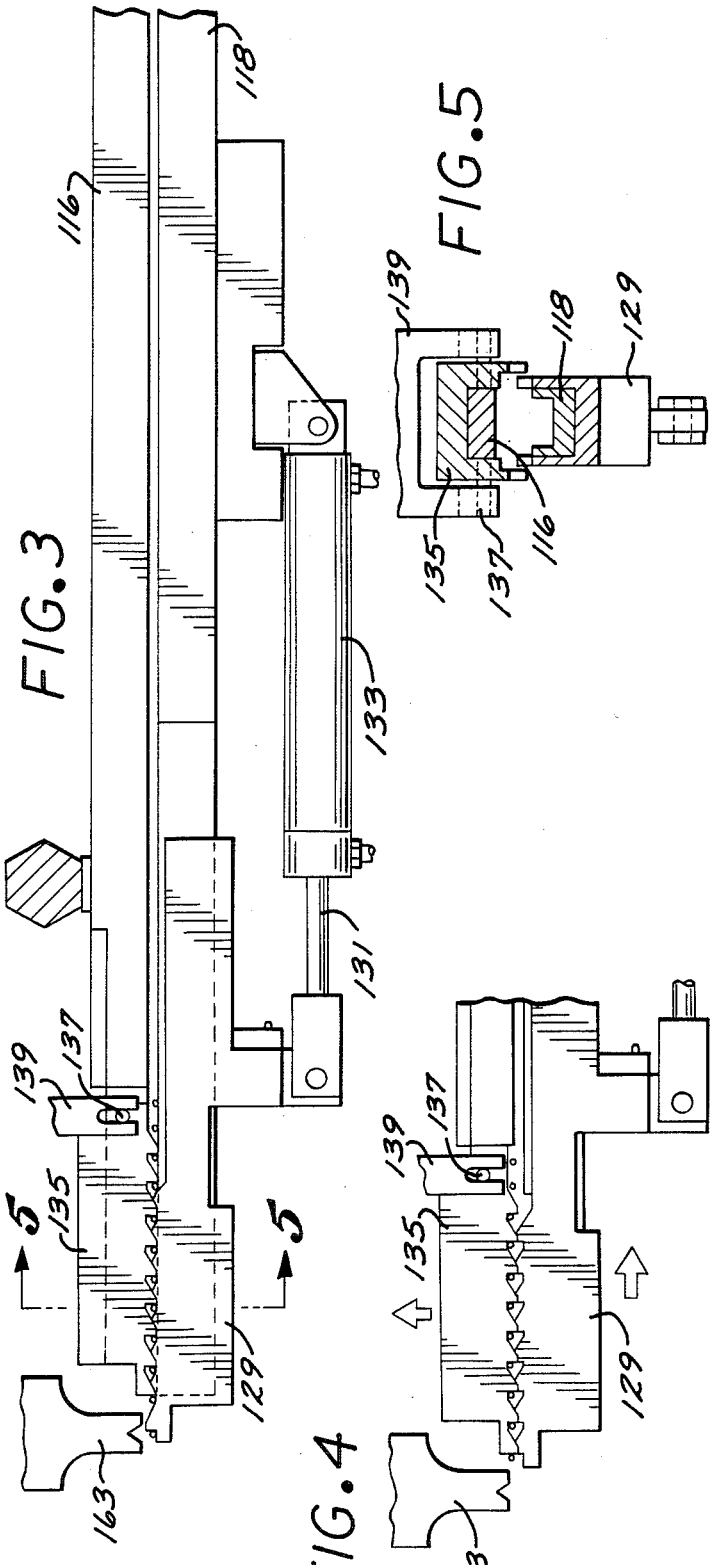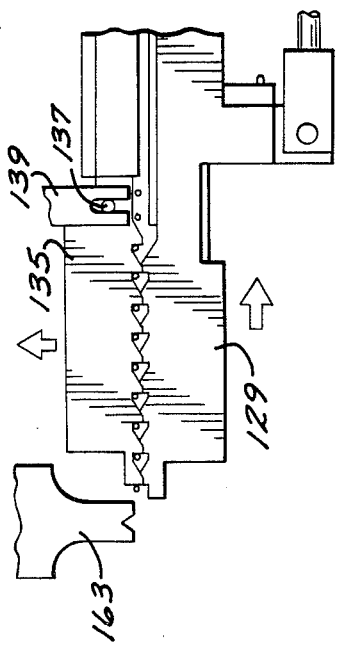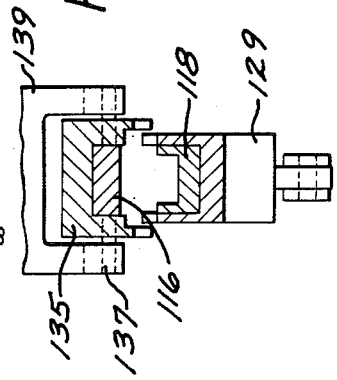

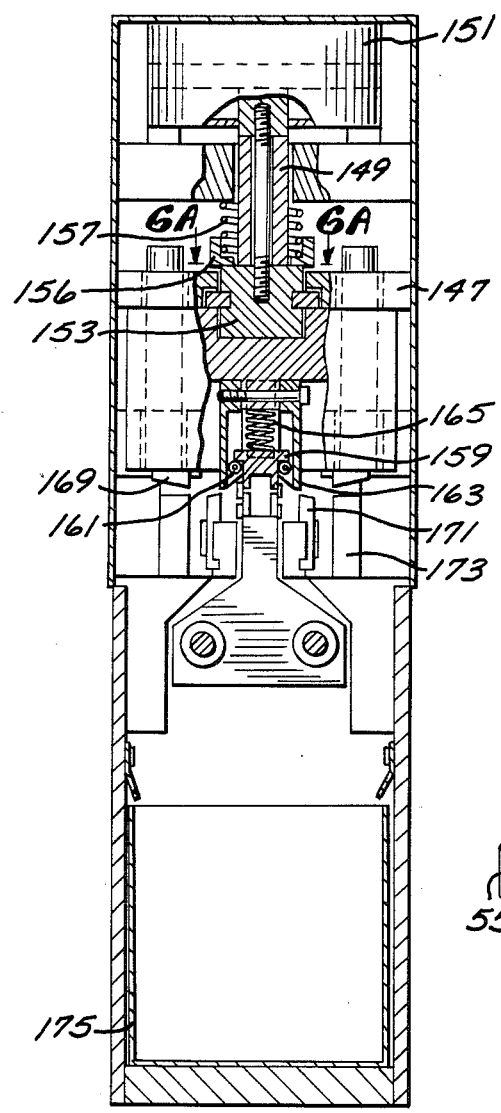
FIG. 6
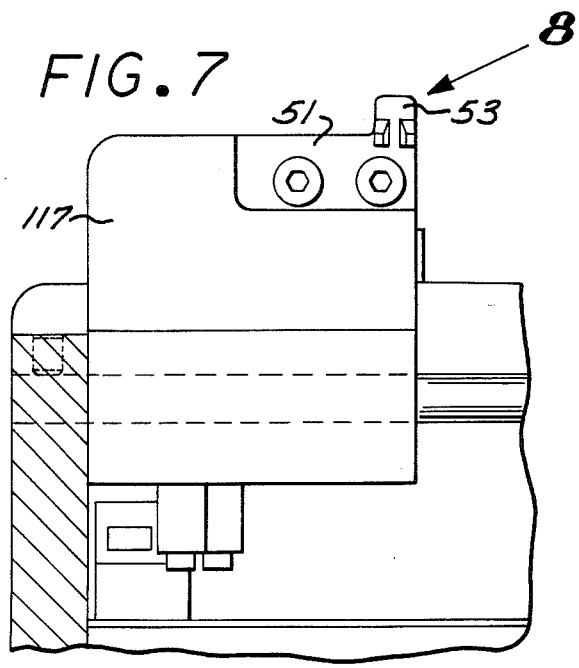
FIG. 7
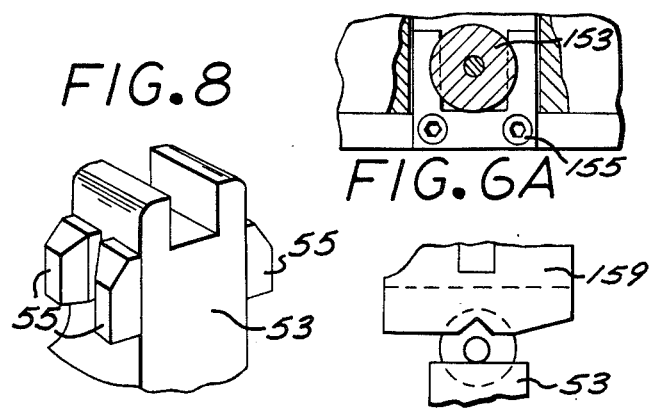
FIG. 8
FIG. 6A
FIG. 10
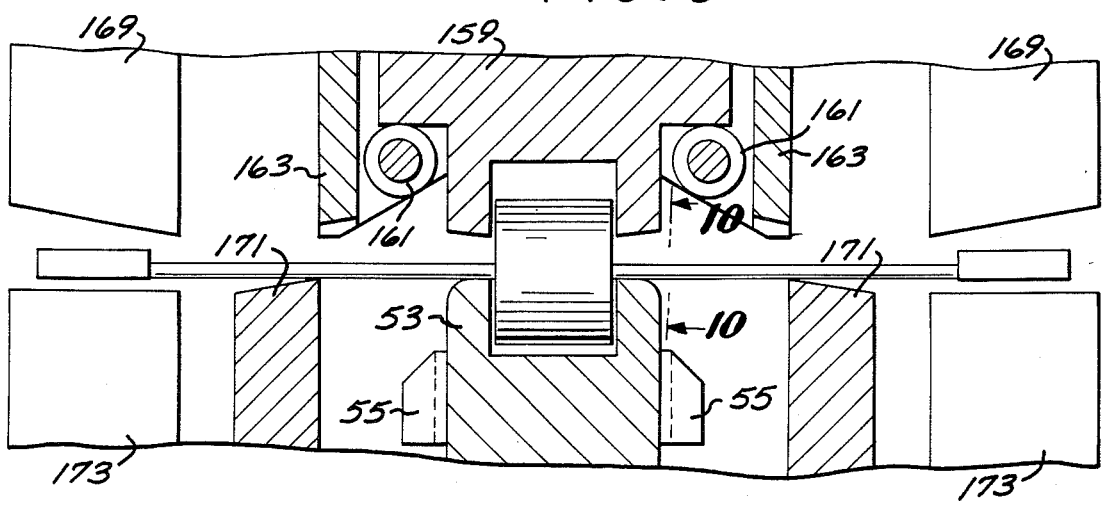
FIG. 9

AXIAL LEAD ELECTRICAL COMPONENT FEEDER

BACKGROUND OF THE INVENTION

The disclosed invention generally relates to apparatus for cutting and forming the leads of taped electrical components, and is more particularly directed to apparatus for cutting and forming the leads of taped components having axial leads.

For utilization in the fabrication of electrical circuits, electronic components such as resistors, capacitors, and diodes are provided by component manufacturers with their leads secured to an elongated tape. A particular type of component configuration, generally known as axial lead components, have leads which emerge from generally opposite sides of the component. Taped axial lead components are generally taped on both leads.

For utilization, taped axial lead electronic components are separated from the tape by cutting the leads and appropriately forming the cut leads for insertion. The cutting and forming has generally been performed with different types of machinery.

However, certain known apparatus for cutting and forming taped axial lead components do not have the capability to present processed components for robotic pick-up, such apparatus being configured to release processed components into a container or being integrated with other apparatus for inserting processed components into circuit boards. Other known apparatus, while intended for presenting components for robotic pick-up, do not provide consistent results in the cutting and forming of the component leads.

SUMMARY OF THE INVENTION

It would therefore be an advantage to provide a cut and form apparatus for taped axial lead electrical components which provides consistent bend widths and leg lengths and presents the processed component for robotic pick-up.

The foregoing and other advantages and features are provided by a component lead cutting and forming apparatus which includes apparatus for supporting the first and second leads of an axial lead component in process, such supporting apparatus being translatable between first and second positions. A translatable assembly is provided for (a) providing strain relief clamping of the leads of the component in process against the component supporting apparatus, (b) cutting the leads of the component in process, and (c) cooperating with the component supporting apparatus to bend the leads of the component in process, when the supporting apparatus is in the first position. Driving apparatus translates the component supporting apparatus between the first position and the second position, wherein at the second position the axial lead component having cut and formed leads is presented for robotic pick-up.

BRIEF DESCRIPTION OF THE DRAWING

The advantages and features of the disclosed invention will readily be appreciated by persons skilled in the art from the following detailed description when read in conjunction with the drawing wherein:

FIG. 1 is a sectional elevational view of the disclosed taped axial lead cut and form apparatus.

FIG. 2 is a sectional plan view taken along the section lines 2 in FIG. 1.

FIG. 3 is an elevational view of the ratchet feeding mechanism of the taped axial lead cut and form apparatus of FIG. 1.

FIG. 4 is partial view of the ratchet mechamism of FIG. 3 illustrating its operation while being retracted.

FIG. 5 is a sectional view taken along the section lines 5 in FIG. 3.

FIG. 6 is a partial sectional elevational view illustrating a translatable assembly of the taped axial lead cut and form apparatus of FIG. 1.

FIG. 6A is a partial sectional detail taken along the section lines 6A in FIG. 6.

FIG. 7 is an elevational view illustrating the component supporting movable carriage of the taped axial lead cut and form apparatus of FIG. 1.

FIG. 8 is a detail view of the anvil portion of the bending die secured to the movable carriage illustrated in FIG. 7.

FIG. 9 is a detail view showing the support of a taped axial lead component in the cut and form apparatus of FIG. 1.

FIG. 10 illustrates the aligning notches of the strain relief clamp of the translatable assembly shown in FIG. 6.

DETAILED DESCRIPTION

Figure 11:
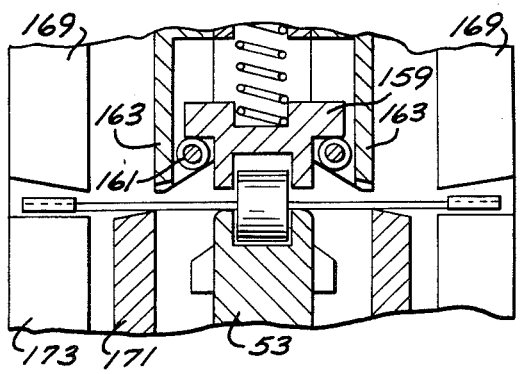
FIGS. 11-14 illustrate the component lead strain relief clamping, cutting, and forming operations provided by the cooperation of the moving assembly and the bending die secured to the movable carriage.

In the following detailed description and in the several figures of the drawing, like elements are identified with like reference numerals.

Overview

The disclosed taped axial lead cut and form apparatus generally includes a movable carriage on which a bending die is secured. The movable carriage is controllably translated between an electrical component processing location and a robotic pick-up location. At the processing location, a taped axial lead electrical component, referred to as the component in process, is fed onto the bending die. A slider assembly including a spring biased strain relief, upper lead cutting blades, lead bending rollers, and upper tape cutting blades is translated downwardly toward the component in process.

At first, the spring biased strain relief clamps the axial component leads against the bending die, and remains stationary as the remaining portions of the slider assembly continue to translate downwardly. The upper lead cutting blades of the slide assembly then engage the component leads and in conjunction with stationary lower lead cutting blades cut the component leads. After the leads are cut, the upper lead cutting blades on the slider assembly continue to engage the lead portions coupled to the component in process and begin to bend such lead portions against the bending die. Pursuant to further translation of the slide assembly, the bending rollers engage the component leads and bend such leads against the bending die.

After the slider assembly has been translated sufficiently, it is controlled to translate upwardly to clear the now processed component. The movable carriage is then translated to the robotic pick-up location for presentation of the processed component, such robotic pick-up location being clear of the slider assembly.

Embodiment Details

Referring now to FIG. 1, the disclosed cut and form apparatus 110 generally includes parallel side plates 111 which provide support for the components of the cut and form apparatus as well as being side covers. The parallel side plates 111 further support a reel 113 of taped components having axial leads. As is well known, both leads of each of such axial lead electrical components are taped, with first and second tapes being secured to corresponding first and second leads of the taped axial lead electrical components.

The taped axial lead components are guided by idler wheels 115, elongated upper tape guides 116, and elongated lower tape guides 118. By way of example, the upper tape guides 116 include outside guides for guiding the taped leads and also include a central guide for guiding the component bodies. The lower tape guides 118 may be similarly structured, with outside guides for guiding the taped leads and a central guide for guiding the component bodies. As will be discussed further herein, the taped components are fed by a ratchet mechanism which generally includes a driven ratchet and a non-driven, floating ratchet.

Referring also to FIG. 2, the cut and form apparatus 110 further includes a movable carriage 117 which is translatable along parallel guide shafts 119 which are appropriately secured to a supporting plate 121 and a supporting block 123 secured to the side plates 111. The movable carriage 117 is secured to the actuating rod 125 of an air cylinder 127 which is secured to the support block 123 on the opposing side from the guide shafts 119. The actuating rod 125 passes through a bore in the supporting block 123.

Referring more particularly to FIGS. 7 and 8, a bending die 51 is secured, for example by threaded fasteners, to the movable carriage 117. The bending die 51 includes a protruding anvil portion 53 which has a centrally located recess for accomodating the body of the component in process. The top of the anvil portion 53 is generally planar with rounded lead forming surfaces that merge with vertical side surfaces. As will be discussed further herein, the component in process is clamped against the top of the anvil portion 53, and the leads are formed against the rounded lead forming surfaces. The leads being formed are directed into lead capturing ears 55 which are on opposing sides of the anvil portion 53. As shown, the ears on a given side include angled opposing inside surfaces for guiding the leads into engagement between opposing flat surfaces of the ears 55 adjacent the anvil portion 53, which flat surfaces provide for a snug mechanical engagement of the leads.

Referring now to FIGS. 1, 3, 4, and 5, the ratchet feed mechanism for the feeding the taped components includes a lower driven ratchet 129 which is generally elongated and U-shaped in cross section. The driven ratchet 129 includes parallel rows of ramped teeth which are ramped in the feed direction, which with reference to FIGS. 1, 3, and 4 is to the left. The driven ratchet 129 is slidably coupled to the central one of the lower tape guides 118 for linear displacement. The actuating rod 131 of an air cylinder 133 is connected to the driven ratchet 129, selective pressurization of the air cylinder 133 being utilized to displace the driven ratchet. The air cylinder 133 is secured to the central one of the lower tape guides 118.

A non-driven or floating ratchet 135 is located above the driven ratchet 129, resting on top of the central one of the upper tape guides 116. The floating ratchet 135 is generally elongated and U-shaped in cross section, and includes parallel rows of ramped teeth which are ramped in the feed direction. As shown in FIG. 5, the ramped teeth of the floating ratchet 135 are on the outside of the ramped teeth of the driven ratchet 129. The floating ratchet 135 is captured for up and down displacement, and for that purpose includes outwardly positioned pins 137 which are engaged in slots in a U-shaped bracket 139 which is secured to a stationary U-shaped support block 141. As discussed further herein, the U-shaped support block 141 supports a slider assembly which includes component lead cutting and forming apparatus.

In operation, the actuating rod 131 is extended to incrementally feed the taped components so as to provide a component for processing. As the taped components are fed, the floating ratchet 135 is displaced as the component leads slide under the ramped teeth thereof. At some time after the actuating rod 131 is extended to provide an incremental feed of the taped components, it must be retracted to be in position for a subsequent feed. Pursuant to such retraction, the ramped teeth of the driven ratchet 129 slide under the leads of components which are held in place by the teeth of the floating ratchet 135. As discussed further herein, the taped component to be processed may also be clamped to prevent retraction of the taped components when the driven ratchet 129 is retracted.

Referring now to FIGS. 1 and 6, a slider assembly 120 is slidably engaged in the stationary support block 141. The slider assembly 120 includes a generally L-shaped slider block 143 having two guide shafts 145 securely pressed in the horizontal portion thereof. The shafts 145 extend above and below the slider block 143. The lower portions of the guide shafts 145 are engaged in bushings in the lower portion of the support block 141. The upper portions of the guide shafts 145 are engaged in bushings in a plate 147 which is secured to the support block 141.

The actuating rod 149 of an air cylinder 151 is connected to a cylindrical coupling 153 having recesses which are captured by a fork 155 secured to the slider block 143. As shown in FIG. 6, the top portion of the cylindrical coupling 153 is within an opening in the plate 147. The cylindrical coupling 153 and the fork 155 allow for some radial relative motion between the cylindrical coupling 153 and the slider block 143 while retaining axial rigidity. A coil spring 157 surrounds the actuating rod 149 and is compressively retained between the stationary support block 141 and a collar 156. The collar 156 rests against either the top of the cylindrical coupling 153 or the top of the plate 147, depending on the pressurization or venting of the air cylinder 151. The air cylinder 151 is secured to the top of the stationary support block 141.

An assembly including a strain relief 159, bending rollers 161, and upper lead cutting blades 163 is secured to the lower portion of the generally horizontal portion of the L-shaped slider block 143. The strain relief 159 is generally T-shaped and is captured by the bending rollers 161. The lower portion of the strain relief includes two downwardly extending ears for clamping the axial component leads against the bending die 53. A coil spring 165 compressively biases the strain relief 163.

Figure 15:
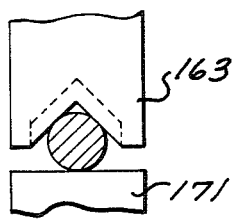
FIG. 15 is a detail view of one of the upper lead cutting blades of the translatable assembly shown in FIG. 6.
Figure 16:
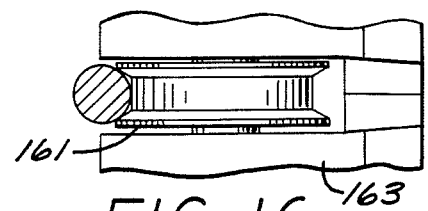
FIG. 16 is a detail view of one of the lead bending rollers of the translatable assembly shown in FIG. 6.
Figure 17:
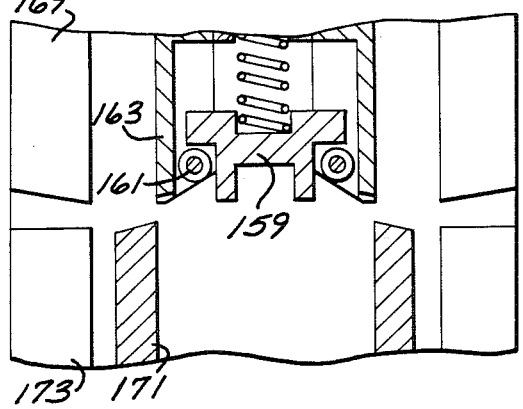
FIG. 17 is a detail view illustrating the translatable assembly shown in FIG. 6 after the movable carriage supporting the processed component has been translated to another position.

As shown more specifically in FIG. 15, the upper lead cutting blades 163 are notched so as to properly locate and minimize any cross sectional distortion of the component leads being cut. Also, as shown in FIG. 10, the bottoms of the protruding strain relief ears include notches for engaging the component leads. As shown more particularly in FIG. 16, the bending rollers 161 have angled sides and flat bottoms for engaging and guiding the leads being formed.

Upper tape cutting blades 169 are secured to the vertical portion of the L-shaped slider block 143.

Stationary lower lead cutting blades 171 are appropriately secured for engagement by the upper lead cutting blades 163; and stationary lower tape cutting blades 173 are appropriately secured for engagement by the upper tape cutting blades 169.

A waste bin 175 is located beneath the slider assembly 120 for receiving the tape scraps that result from the axial lead cutting and forming operations.

With reference to FIGS. 6, 11–14, and 17–18, the above disclosed cut and form apparatus 110 operates as follows. The air cylinder 151 is pressurized to fully retract the actuating rod 149, such fully retracted position being schematically illustrated in FIG. 6. The air cylinder 127 is then pressurized to cause the movable carriage 117 to be located beneath the slider assembly 120. The air cylinder 133 is pressurized to extend the actuating rod 131 to cause the ratchet feed mechanism to feed an axial lead component onto the bending die 53 on the movable carriage 117, as shown in FIG. 11.

Figure 12:
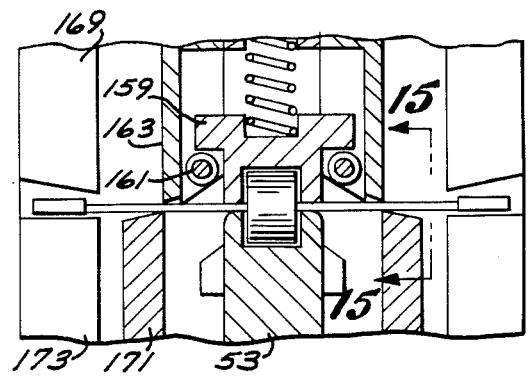

The air cylinder 151 is then vented, which causes the slider assembly 120 to be downwardly translated by the coil spring 157 to the point where the retaining collar 156 rests against the plate 147. As shown in FIG. 12, the ears of the strain relief 159 clamp the leads of the component in process against the bending die 53, while the notches of the upper lead cutting blades engage the leads.

The air cylinder 133 is then pressurized to retract the actuating rod 131, which retracts the driven ratchet 129 away from the component in process and thus away from the cutting and forming elements of the slider assembly 120.

Figure 13:
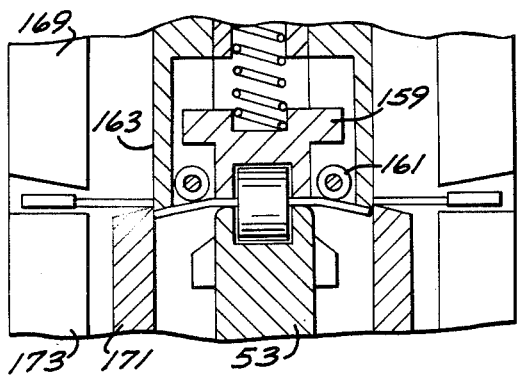
Figure 14:
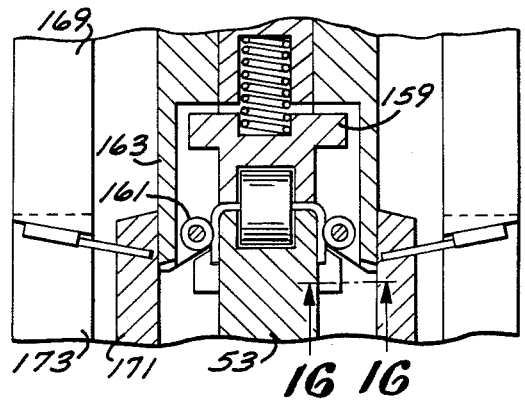
Figure 18:
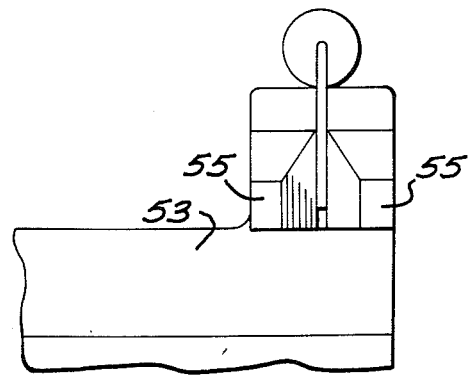
FIG. 18 illustrates the presentation of a processed component on the movable carriage.

The air cylinder 151 is then pressurized to extend the actuating rod 149. Pursuant to such extension, the upper cutting blades 163 force the component leads against the stationary lower lead cutting blades 171, causing the leads to be cut. As shown in FIG. 13, the continued downward displacement of the upper cutting blades 163, which continue to engage the cut leads, begins the bending of such leads against anvil portion 53 of the bending die 51. Still further downward displacement causes the bending rollers 161 to engage the cut leads and form such leads against the anvil portion 53 of bending die 51, as shown in FIG. 14. Such further displacement also causes the tape to be cut. Pursuant to the bending by the bending rollers, the cut and formed leads are snugly inserted between the ears 55 of the anvil portion 53, as shown in FIG. 18.

After the actuating rod 149 is appropriately extended to cut and form the leads, the air cylinder is pressurized to retract the actuating rod 149. After such retraction, the air cylinder 127 is pressurized to translate the movable carriage, and thus also the processed component, away from the slider assembly 120 to a location generally indicated in phantom on FIGS. 1 and 2. At such location, the processed component is ready for robotic pick-up.

Figure 19:
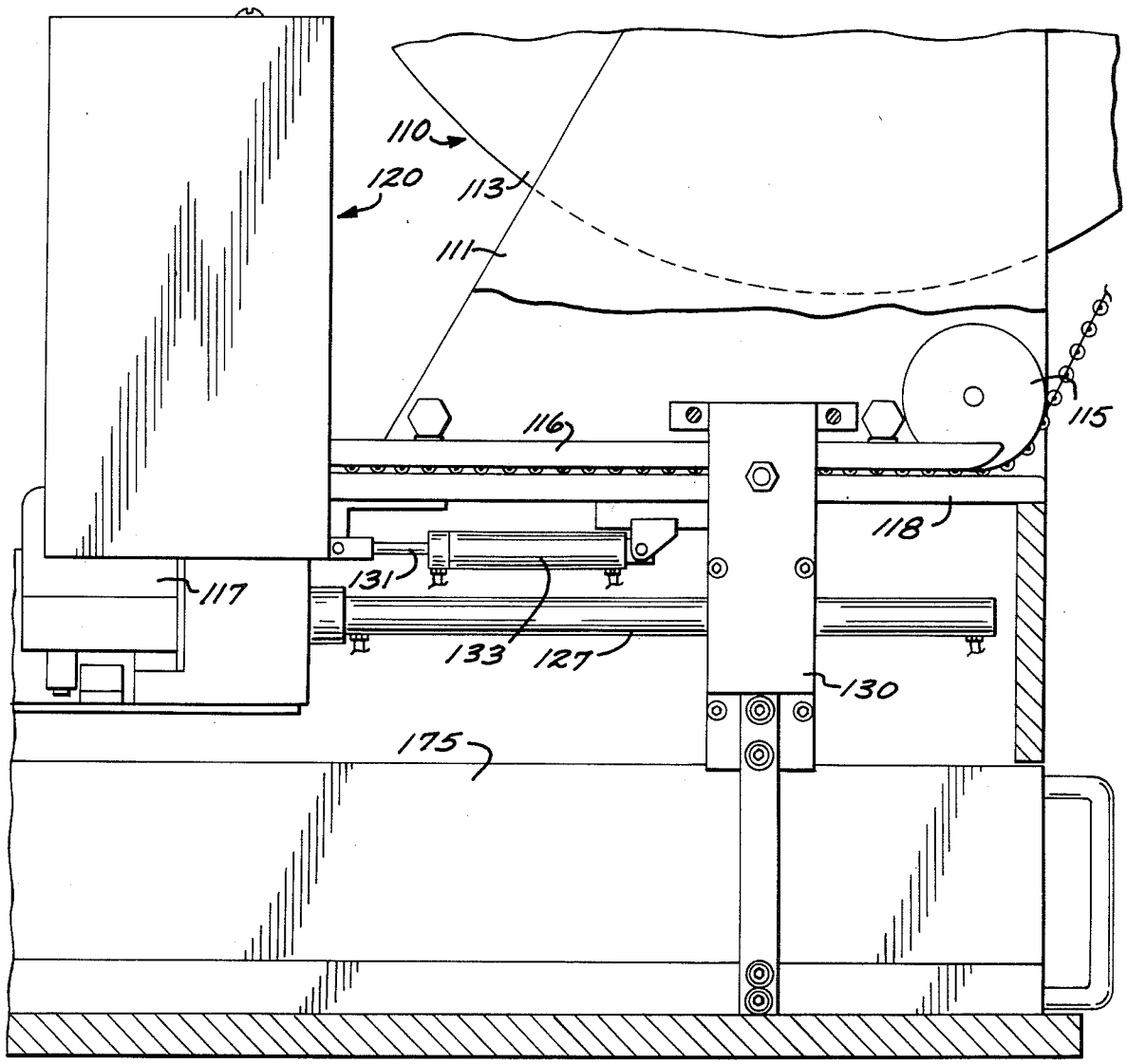
FIG. 19 is an elevational view of a further embodiment of the disclosed taped axial lead cut and form apparatus which includes a standoff forming apparatus.

Referring now to FIG. 19, schematically illustrated therein is the use of a standoff forming apparatus 130 with the cut and form apparatus 110. As is well known, leads of electrical components, including axial lead components, may be formed to provide for a "standoff" configuration wherein "dimples" are formed in the component leads. Such dimples prevent the component leads from being inserted in a circuit board past the dimples, and the component body remains separated from the circuit board.

As shown in FIG. 19, the compact structure of the cutting and forming elements (including the slider assembly 120) of the cut and form apparatus 110, and the elongated upper and lower tape guides advantageously allow for the stand-off forming apparatus 130 to be located between the idler wheels 115 and the air cylinder 133. The formation of the standoff dimples in the axial lead components thus occurs while the component leads are still taped and prior to the cutting and forming operations provided by the cut and form apparatus 110.

Pursuant to well known techniques, the standoff forming apparatus may utilize dimple forming dies which are driven by appropriate air cylinder(s). By way of the example, the standoff forming apparatus 130 can include moving dies which are translated to engage the component leads from below and press the leads against stationary dies located above the leads.

The foregoing has been a disclosure of a cut and form apparatus for taped axial lead electrical components which provides consistent bend widths and leg lengths and presents the processed component for robotic pick-up. Further, the disclosed cut and form apparatus, by virtue of its modularity, provides for easy changing of cutting and forming elements for different components, bend widths, and leg lengths.

Although the foregoing has been a description and illustration of specific embodiments of the invention, various modifications and changes thereto can be made by persons skilled in the art without departing from the scope and spirit of the invention as defined by the following claims.

What is claimed is:

1. A component lead cutting and forming apparatus for axial lead electronic components respectively having first and second leads secured to tape, comprising:
   means for supporting the first and second leads of an axial lead component being processed, said supporting means being translatable between first and second positions;
   translatable means for (a) providing strain relief clamping of the leads of the component being processed against said supporting means, (b) cutting the leads of the component being processed, and (c) cooperating with said supporting means to bend the leads of the component being processed, when said supporting means is in said first position; and means for translating said supporting means between a first position and a second position, wherein at said second position the axial lead component having cut and formed leads is presented for robotic pick-up.

2. The cutting and forming apparatus of claim 1 wherein said supporting means includes a bending die for supporting the first and second leads of the component being processed.

3. The cutting and forming apparatus of claim 2 wherein said translatable means includes a movable biased clamping member having protruding ears for clamping the first and second leads of the component being processed against said bending die.

4. The cutting and forming apparatus of claim 3 wherein said translatable means includes movable cutting blades and stationary cutting blades.

5. The cutting and forming apparatus of claim 4 wherein said translatable means includes bending rollers.

6. The cutting and forming apparatus of claim 5 wherein said movable biased clamping member, said movable cutting blades, and said bending rollers comprise an assembly wherein said movable cutting blades and said bending rollers are fixedly coupled to each other and are together movable relative to said biased clamping member.

* * * * *